United States Patent [19]

Hard

[11] Patent Number: 4,850,897
[45] Date of Patent: Jul. 25, 1989

[54] ADAPTER FOR PROVIDING ELECTRICAL ACCESS TO CIRCUITS IN A CABLE HEAD ASSEMBLY

[75] Inventor: Douglas G. Hard, Fayetteville, Tenn.

[73] Assignee: Hard Engineering, Inc., Huntsville, Ala.

[21] Appl. No.: 166,025

[22] Filed: Mar. 9, 1988

[51] Int. Cl.$^4$ ............................................. H01R 11/00
[52] U.S. Cl. ..................................... 439/502; 439/653; 439/652
[58] Field of Search ........ 439/638, 639, 640, 650–656, 439/912, 68, 73, 502, 629, 709, 503, 504, 505

[56] References Cited

U.S. PATENT DOCUMENTS

| | | | |
|---|---|---|---|
| 3,660,797 | 5/1972 | Firestone | 439/502 |
| 4,462,656 | 7/1984 | Beyer | 439/655 |
| 4,508,403 | 4/1985 | Weltman et al. | 459/502 |
| 4,569,567 | 2/1986 | Zucchini | 439/639 |
| 4,690,475 | 9/1987 | McElroy | 439/502 |

FOREIGN PATENT DOCUMENTS 1296810  5/1962  France ................................ 439/652

Primary Examiner—David Pirlot
Attorney, Agent, or Firm—C. A. Phillips

[57] ABSTRACT

An adapter for providing electrical access to individual circuits of a telephone circuit cable head is disclosed. The adapter has an elongated rectangular housing and is intended for placement between rows of receptacles of the cable head and protective plugs that mate with the cable head. Five sets of pins and sockets per receptacle are supported by the housing, with the pins for each set extending downward from a lower planar surface for engagement with sockets of the cable head and sockets for each set extending inward from an upper planar surface. Three sets of pins and sockets for each receptacle are connected to one another, providing uninterrupted electrical contact. The other two, coupled to tip and ring wires, are interrupted by a gap leaving pin and socket ends within the housing. These ends have wires joined to them, the wires extending outward for connection to test equipment. The wires in turn are coupled to a connector half for use with computerized test equipment.

1 Claim, 3 Drawing Sheets

ADAPTER FOR PROVIDING ELECTRICAL ACCESS TO CIRCUITS IN A CABLE HEAD ASSEMBLY

TECHNICAL FIELD

This invention relates generally to telephone circuits and more particularly to an adapter for obtaining electrical access to individual circuits in a cable head assembly.

BACKGROUND OF THE INVENTION

Telephone circuits for individual telephone and computer data transmission lines are normally routed through a cable head wherein each circuit is connected to a receptacle that mates with a protective plug. The plug has a coil and carbon-gap feature that serves as a fuse upon appearance of excess current in its circuit from lightning or other sources of stray current. In effect each plug acts as a normally closed relay, opening upon exposure to excess current and providing a path to ground when open. The cable head is in the form of a rectangular insulating block having an array of a large number of receptacles, typically one hundred, arranged in spaced-apart relationship on the block. Banks of cable heads stacked one one another are normally located in telephone central offices so as to provide centralized access to the protective plugs for all telephone lines.

While disabled plugs are readily available for replacement in this arrangement, obtaining electrical access to wires of individual circuits for purposes of troubleshooting and testing has proven difficult. In order to utilize test equipment that may include computerized systems for analyzing and determining circuit conditions, wires of the individual circuit must be located and electrically connected to wires of the test equipment. Presently used procedures require that wires leading to cable head sockets for a specific circuit must be identified from hundreds of other wires feeding outward from the cable head assembly into a common conduit. Tip and ring wires for the circuit would then be stripped of insulation and spliced to wires leading to test equipment. The circuit would then be broken between the central office and outside lines. This provides for interactive testing of the disconnected circuits. In addition to being time-consuming, this procedure entails a risk of damaging circuit wires that are stripped as well as other wires and insulation. A need thus exists for more convenient and effective access to circuits in the cable head.

SUMMARY OF THE INVENTION

The present invention is directed to an adapter for placement between a telephone circuit cable head and protective plugs that engage the head. The adapter has wires that extend outwardly from their connection to interrupted pins and sockets inside the adapter housinng, these wires being connectable to test equipment for ascertaining the condition of individual circuits in the head. The adapter includes an insulating housing with upper and lower generally planar surfaces. Sockets forming receptacles for protective plugs are disposed within the upper surface, and pins that mate with sockets in the cable head project downward from the lower surface. Some pin and socket combinations extend all the way through the housing, providing uninterrupted direct electrical connection bettween pins of the plugs and sockets of the head. Others are interrupted inside the adapter and have wires connected to their exposed ends inside the adapter. The latter wires, normally four for each circuit, are threaded through the adapter housing to a cable and connector making contact with terminals of test equipment or the like. The adapter preferably has an elongated rectangular shape corresponding to one or two rows of receptacles on the cable head. By providing external wires from which circuit conditions for individual circuits may be determined the adapter obviates the need for physically identifying individual wires of the cable head assembly and for stripping and splicing them to leads from test equipment. Access to individual circuits for the purpose of monitoring them while in use is also provided.

It is therefore an object of this invention to provide an adapter for obtaining electrical access to individual circuits in a cable head.

Another object is to provide electrical access to telephone circuits in a cable head without disturbing wires that are connected to the cable head.

Still another object is to provide an adapter that has outwardly extending wires electrically connected at their inner ends to selected sockets of the cable head and selected pins of protective plugs.

Yet another object is to provide an adapter that is connectable to a cable head and that enables the condition of circuits in the cable head to be determined.

BRIEF DESCRIPTION OF THE DRAWINGS

FIG. 1 is a pictorial view showing tow adapters embodying the invention, one plugged into a cable head and the other aligned for being plugged in.

DESCRIPTION OF THE PREFERRED EMBODIMENT

Figure 1:
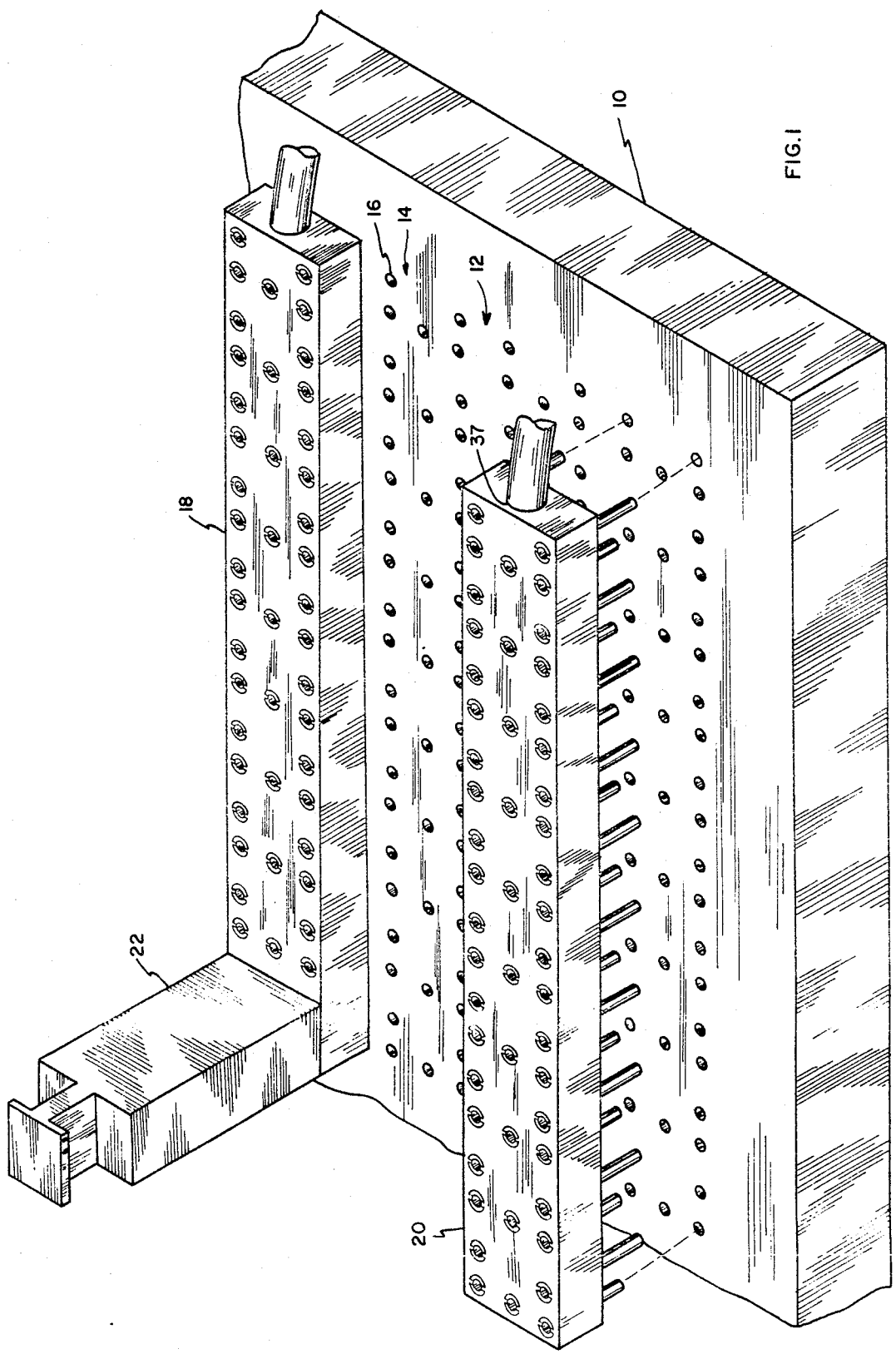

Referring to FIG. 1 of the drawings, a portion nof a telephone circuit cable head 10 is shown. The cable head has multiple rows 12 of receptacles, ten receptacles per row, with each receptacle 14 having five sockets 16 electrically connected to wires (not shown) of an individual telephone circuit. Adaptor 18 at the top of the drawing is shown engaged in the cable head while adapter 20 is shown lined up for engagement. Adapter 18 has inserted in its end receptacle a protective plug 22, one of which, in the absence of an adapter of the present invention, would be plugged into each receptacle on the cable head. The plug is of conventional design having pins (not shown) that mate with sockets of a receptacle.

Figure 2:
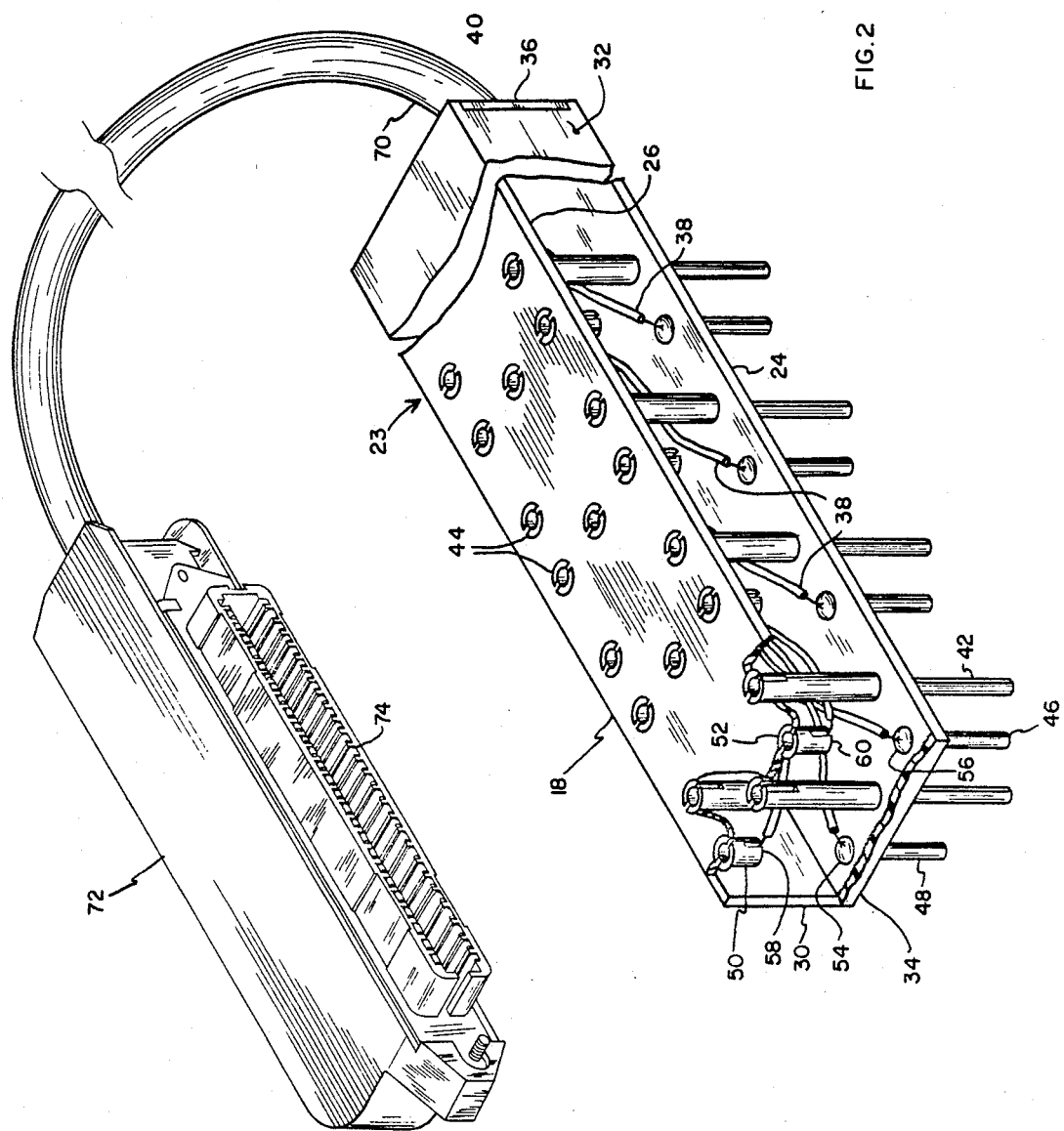
FIG. 2 is a pictorial view, partly in section and partly broken away, of an adapter and its associated cable and connector.

FIG. 2 shows details of an adapter 18 embodying the invention. The adapter has an insulating housing 24 of elongated rectangular shape, the housign being made up of top plate 26, bottom plate 24, side plates 30 and 32, closed end plate 34 at one end, partially broken away in this view, and opposite end plate 36 having an opening 37 (FIG. 1) to provide a path for wires 38 that extend to and are disposed within cable 40. Ten sets of five each pins and sockets are provided in the adapter, corresponding to the ten receptacles of a row in the cable head. The pins 42 extend pepepndicularly downward from bottom plate 24 and are placed for mating with sockets 16 of receptacles 14 of the cable head. Sockets 44 of the adapter are disposed within the housing, with their upper end generally flush with top plate 26, and they are arranged for mating with pins (not shown) of protective plugs 22 in the same manner the plugs would be engaged with the cable head in the absence of the adapter. Three of the pin and socket pairs of each receptacle are permanently secured to one another so that they provide uninterrupted, direct electrical connection between pins of the plugs and sockets of the heads. The two pin and socket pairs for tip and ring wires of a telephoen circuit, pins 46 and 48 and sockets 50 and 52 as shown n FIG. 2, are notin electrical contact with one another but are interrupted by a gap, leaving pin ends 54 and 56 and nsocket ends 58 and 60 exposed andn available for connection to outside equipment. Each of the exposed pin and socket ends within the housing is connected to a separate wire 38 by means such as soldering of teh wire to the pin or socket end, and the wires are threaded outwardly through the housing between pins. In the embodiment shown in FIG. 2, only four receptacles are shown for purposes of clarity; six additional receptacles would be provided in the borken-away portion of the adapter. Wires 38 extend outward through opening 37 in end 36 ofo the adapter and are placed together within a sheath 70 forming a multiwire cable 40. Wires 38 of cable 40 in turn are connected to a connector half 72 having a multiplicity of electrical contacts 74, the connector shown in the drawing beign a standard commercial item available under the designation trade Amphenol TM No. 1578950001. While the connector half shown is of the female type, a male connector half, such as is available under the designation AMP TM No. 554887-2, may also be used.

In operation of a circuit head assembly using an adapter embodying the invention, adapters are plugged into each row of receptacles of a cable head, and protective plugs are engaged in receptacles of the adapter. The connector half to which wires from interrupted pin and socket pairs oof the adapter are electrically connected is engaged with a mating connector half of appropriate test equipment such as a matrix device. During normal usage of the circuit, the sets of wires extending outward from teh adapter and through the matrix device will be maintained as a closed circuit. However, they are available for testign and montorig by means such as computerized equipment, which can provide a readout showing the condition of the circuit from electrical signals obtained from the interrupted pin and socket pairs.

Figure 3:
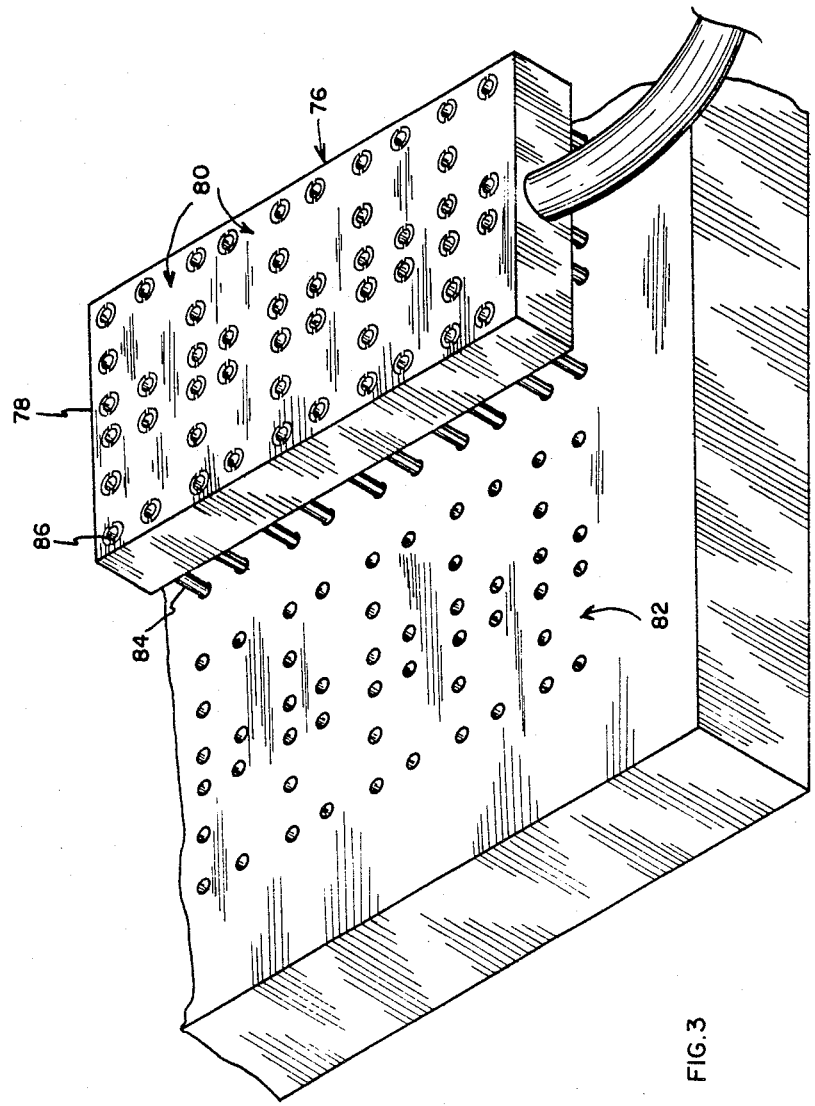
FIG. 3 is a pictorial view showing an alternate embodiment of the invention that engages two rows of receptacles on a cable head, each row having five receptacles.

FIG. 3 shows an embodiment of the invention for use on a circuit head that has only five receptacles 82 per row in one direction, but has twenty rows. The adapter 76 in this embodiment has a housing 78 in which receptacles 80 are provided to correspondn to two rows of receptacles 82 on the circuit head. Pins 84 and sockets 86 along with interrupted pin and socket pairs having wires connected to them (not shown) are provided in the same manner as for the single row adapter shown in FIGS. 1 and 2. The two-row adapter provides the same results as the single-row adapter, the arrangement of receptacles in the adapter being changed to be compatible with the particular cable head design.

The invention is not limited to a specific number of receptacles in the adapter. Beyond a certain number of receptacles, however, it becomes unduly difficult to insert and remove the adapter because of the amount of friction between matingn pins adn sockets. In the embodiments shown, the adapter includes ten receptacles to correspond to one or two rows in the cable head. The provision of a potting compound within the interior of the adapter housing is another modification that may be made with the scopep of the invention.

We claim:

1. In combination, a telephone circuit cable head having a plurality of telephone circuit receptacles, one receptacle for each circuit, said receptacles being arranged in rows and each having a plurality of sockets connected to wires of one of said circuits, including a tip wire and a ring wire and disposed in a planar array;

an elongated rectangular insulating housing having generally planar upper and lower surfaces;

a plurality of receptacle units supported by said housing, each such unit having a plurality of sets of pins and sockets corresponding to sockets of receptacles of said cable head;

each of said sets of pins and sockets having its pins extended downward perpendicularly from said lower surface and arranged for engagement with sockets of the cable head and having its sockets extending inward perpendicularly from said upper surface and arranged for engagement with pins of a plug device;

selected ones of said sets of pins and sockets of each receptacle unit of said adapter being joined together and adapted to provide uninterrupted, direct electrical contact between sockets of said cable head and pins of said plugs;

selected other sets of pins and sockets in said adapter, including sets disposed for electrical connection of the pin thereof with the socket of a cable head receptacle that is coupled to the tip wire of a circuit and the pin that is coupled to the ring wire of the same circuit, being interrupted by a gap and having a pin end and a socket endn within the adapter housing; and a plurality of wires for coupling said pin and socket ends in said housing with external equipment.

* * * * *